(12) United States Patent
La Forest et al.

(10) Patent No.: US 10,370,302 B2
(45) Date of Patent: Aug. 6, 2019

(54) FACILITATING PITCH STABILIZATION IN DENSIFIED CARBON FIBER PREFORMS

(71) Applicant: Honeywell International Inc., Morristown, NJ (US)

(72) Inventors: Mark L. La Forest, Granger, IN (US); Slawomir T. Fryska, Granger, IN (US); David Flask, Granger, IN (US); David M. Wright, Voglers Cove (CA); Roger L. Klinedinst, North Liberty, IN (US)

(73) Assignee: Honeywell International Inc., Morris Plains, NJ (US)

( * ) Notice: Subject to any disclaimer, the term of this patent is extended or adjusted under 35 U.S.C. 154(b) by 671 days.

(21) Appl. No.: 14/475,222

(22) Filed: Sep. 2, 2014

(65) Prior Publication Data

US 2016/0102023 A1    Apr. 14, 2016

(51) Int. Cl.
*C04B 35/83* (2006.01)
*B23K 26/364* (2014.01)
(Continued)

(52) U.S. Cl.
CPC ............ *C04B 35/83* (2013.01); *B23K 26/364* (2015.10); *C23C 16/045* (2013.01); *C23C 16/26* (2013.01);
(Continued)

(58) Field of Classification Search
CPC .............. C04B 35/83; C04B 2235/616; C04B 2235/612; B26K 26/364; C23C 16/045
See application file for complete search history.

(56) References Cited

U.S. PATENT DOCUMENTS 3,734,797 A * 5/1973 Byers ..................... B32B 18/00
                                                    156/253
4,615,855 A   10/1986 Orlowski et al.
(Continued)

FOREIGN PATENT DOCUMENTS

EP       0875452 A2    11/1998
EP       2267081 A1    12/2010
(Continued)

OTHER PUBLICATIONS

Response to Extended Search Report dated Dec. 4, 2015, from counterpart European Application No. 15181890.3, filed Mar. 9, 2016, 10 pp.
(Continued)

*Primary Examiner* — Galen H Hauth
(74) *Attorney, Agent, or Firm* — Shumaker & Sieffert, P.A.

(57) ABSTRACT

A method of forming a densified preform or composite part is disclosed that includes partially densifying a porous preform, forming channels in the partially densified preform that open to an exterior surface of the partially densified preform, infiltrating a densifying agent, such as pitch, into at least some of the channels of the partially densified preform, at least partially stabilizing the densifying agent, including heating at a first temperature, such that cracks form within the densifying agent, and exposing the preform to an oxidizing agent, and heating the at least partially stabilized preform at a second temperature to carbonize at least the stabilized densifying agent. A partially densified preform including a densifying agent disposed at least in such channels also is disclosed.

17 Claims, 4 Drawing Sheets

(51) Int. Cl.
*C23C 16/04* (2006.01)
*F16D 69/02* (2006.01)
*C23C 16/26* (2006.01)

(52) U.S. Cl.
CPC ...... *F16D 69/023* (2013.01); *C04B 2235/612* (2013.01); *C04B 2235/616* (2013.01)

(56) References Cited

U.S. PATENT DOCUMENTS

| | | | |
|---|---|---|---|
| 4,659,624 A * | 4/1987 | Yeager | B29C 70/086 |
| | | | 156/245 |
| 4,986,943 A | 1/1991 | Sheaffer et al. | |
| 5,405,560 A * | 4/1995 | Chareire | C04B 35/83 |
| | | | 264/29.5 |
| 5,705,008 A | 1/1998 | Hecht | |
| 2003/0008125 A1 | 1/2003 | Delanoy et al. | |
| 2004/0058154 A1 * | 3/2004 | Lau | C04B 35/6286 |
| | | | 428/408 |
| 2004/0211354 A1 | 10/2004 | Guirman et al. | |
| 2004/0241078 A1 | 12/2004 | Inoue et al. | |
| 2006/0279012 A1 * | 12/2006 | Simpson | B29C 70/48 |
| | | | 264/29.5 |
| 2007/0007678 A1 | 1/2007 | Benitsch | |
| 2008/0090064 A1 * | 4/2008 | James | C04B 35/573 |
| | | | 428/292.1 |
| 2008/0141938 A1 | 7/2008 | Chandran et al. | |
| 2008/0224343 A1 | 9/2008 | Baldwin et al. | |
| 2009/0169836 A1 | 7/2009 | Thomas | |
| 2010/0035126 A1 | 2/2010 | Breault | |
| 2011/0275266 A1 | 11/2011 | Lecostaouec | |
| 2012/0156466 A1 | 6/2012 | Bell et al. | |
| 2013/0214442 A1 | 8/2013 | Naskar | |
| 2013/0231024 A1 | 9/2013 | Lecostaouec et al. | |
| 2015/0005151 A1 | 1/2015 | Baba et al. | |
| 2016/0046491 A1 | 2/2016 | Mihara | |
| 2016/0060115 A1 | 3/2016 | La Forest et al. | |
| 2016/0102023 A1 | 4/2016 | La Forest et al. | |

FOREIGN PATENT DOCUMENTS

| | | |
|---|---|---|
| WO | 0061518 A1 | 10/2000 |
| WO | 0218120 A2 | 3/2002 |
| WO | 0228801 A2 | 4/2002 |
| WO | 2004052629 A1 | 6/2004 |

OTHER PUBLICATIONS

Gilman et al., "Thermal Decomposition Chemistry of Poly(vinyl alcohol)", Chapter 11. Fires and Polymers II, American Chemical Society, ACS Symposium Series, Aug. 21-26, 1994, 25 pp.
Office Action from U.S. Appl. No. 14/475,181, dated Sep. 13, 2016, 12 pp.
Extended Search Report from counterpart European Application No. 15181890.3, dated Dec. 4, 2015, 7 pp.
Savage, "Carbon-Carbon Composites; section 5.8, Low-Pressure Composites Processing," Springer, 1993, 2 pp.
Search Report from European Application No. 1518891.1, dated Jan. 29, 2016, 8 pp.
Final Office Action from U.S. Appl. No. 14/475,181, dated Apr. 4, 2017, 12 pp.
Response to Office Action dated Apr. 4, 2017, from U.S. Appl. No. 14/475,181, filed Jun. 1, 2017, 15 pp.
Office Action from U.S. Appl. No. 14/475,181 dated Sep. 14, 2017, 9 pp.
Response to Office Action dated Sep. 14, 2017, from U.S. Appl. No. 14/475,181, filed Dec. 12, 2017, 9 pp.
Response to Office Action dated Sep. 13, 2016, from U.S. Appl. No. 14/475,181, filed Dec. 13, 2016, 12 pp.
Response to Office Action dated Jun. 3, 2016, from U.S. Appl. No. 14/475,181, filed Jul. 26, 2016, 3 pp.
Notice of Allowance from U.S. Appl. No. 14/475,181, dated Feb. 16, 2018, 7 pp.
Prosecution History from U.S. Appl. No. 15/285,589, dated Dec. 6, 2017 through Feb. 2, 2018, 8 pp.
Office Action from U.S. Appl. No. 15/285,589, dated Apr. 19, 2018, 11 pp.
Notice of Allowance from U.S. Appl. No. 14/475,181, dated Apr. 17, 2018, 3 pp.
Response to Office Action dated Apr. 19, 2018, from U.S. Appl. No. 15/285,589, filed Jul. 18, 2018, 14 pp.
Examination Report from counterpart European Application No. 15181890.3, dated Jun. 29, 2018, 6 pp.

* cited by examiner

FACILITATING PITCH STABILIZATION IN DENSIFIED CARBON FIBER PREFORMS

TECHNICAL FIELD

This disclosure describes techniques for processing porous preforms that include densifying agents.

BACKGROUND

Carbon fiber-reinforced carbon materials, also referred to as carbon-carbon (C—C) materials, are composite materials that generally include carbon fibers reinforced in a matrix of carbon material. The C—C composite materials are found in many rigorous, high temperature applications. For example, the aerospace industry is known to employ C—C composite materials for manufacturing different aircraft structural components. The carbon fiber used in C—C composite materials may be arranged to define a shape of a resulting structural component and, as such, may be referred to as a preform. The preform may undergo different processing steps to increase the carbon content and density of the preform to transform the preform into a C—C composite component. For example, carbon may be added to the preform using one or more pitch densification processes. In general, a pitch densification process operates to impregnate a carbon fiber preform with pitch that is subsequently cooled and solidified to produce a dense, high carbon content C—C component. Porous preforms may be densified using one of several densification processes, for example, chemical vapor deposition/chemical vapor infiltration (CVD/CVI), vacuum pressure infiltration (VPI), high pressure impregnation/carbonization (PIC), or resin transfer molding (RTM), which may introduce carbon or carbon precursors into the porous preform.

SUMMARY

In general, the disclosure relates to techniques for densifying porous preforms and forming carbonized preforms. In one example, the disclosure is directed to a technique that includes infiltrating a densifying agent into at least some pores of a plurality of pores of a partially densified preform to form an infiltrated preform, and forming a plurality of channels at least partially in the densifying agent of the infiltrated preform, such that each channel of the plurality of channels opens to at least one exterior surface of the infiltrated preform. The example technique further includes at least partially stabilizing at least the densifying agent to form an at least partially stabilized preform, by at least heating the infiltrated preform comprising the plurality of channels at a first temperature, and exposing the infiltrated preform comprising the plurality of channels to an oxidizing agent to stabilize at least the densifying agent and form the at least partially stabilized preform. The example technique also includes heating the at least partially stabilized preform at a second temperature to carbonize at least the stabilized densifying agent to form a carbonized preform.

In another example, the disclosure is directed to a technique that includes infiltrating a densifying agent into at least some pores of a plurality of pores of a partially densified preform to form an infiltrated preform, and forming a plurality of channels at least partially in the densifying agent of the infiltrated preform, such that each channel of the plurality of channels opens to at least one exterior surface of the infiltrated preform. This example technique further includes at least partially stabilizing at least the densifying agent to form an at least partially stabilized preform, by at least heating the infiltrated preform comprising the plurality of channels at a first temperature, and exposing the infiltrated preform comprising the plurality of channels to an oxidizing agent to stabilize at least the densifying agent and form the at least partially stabilized preform. This example technique also includes heating the at least partially stabilized preform at a second temperature to carbonize at least the stabilized densifying agent to form a carbonized preform.

The disclosure also describes an example partially densified preform including a plurality of fibers defining a plurality of pores between the plurality of fibers, a plurality of channels, wherein each channel of the plurality of channels opens to at least one exterior surface of the partially densified preform, and a densifying agent disposed in at least some pores of the plurality of pores and at least some channels of the plurality of channels.

The details of one or more examples are set forth in the accompanying drawings and the description below. Other features, objects, and advantages of the disclosure will be apparent from the description and drawings, and from the claims.

DETAILED DESCRIPTION

The oxygen stabilization of pitch during the processing of pitch-densified preforms can take weeks for preforms having large dimensions, for example, carbon-carbon aircraft brake disc preforms including friction materials, due to the tight porosity of pitch that may prevent diffusion of oxygen in to central regions of the preform. In some examples, when stabilization of pitch is considered complete, pitch that has not fully stabilized remains trapped in central regions of the preform and can leak during subsequent processing steps, including high temperature carbonization of the pitch.

This disclosure provides techniques that include forming channels in a partially densified preform, which may facilitate greater gas infusion throughout the partially densified preform. In some examples, forming channels in the partially densified preform also allows for egress of gases or other volatiles generated during the processing of partially densified preforms. For example, carbonizing stabilized pitch in a preform or a phase change of pitch from solid to molten phases may generate pressure in a partially densified preform. This pressure may cause damage to the partially densified preform, including linear cracks. Adding channels to the porosity of a preform may facilitate greater diffusion rates of gases and volatiles into and out of central regions (e.g., internal volumes) of preforms and partially densified preforms.

In some examples, the channels may reduce the time required for oxidative stabilization of a densifying agent, such as pitch, infiltrated in preforms or partially densified preforms, may increase an amount of densifying agent that is stabilized, or both. By improving densifying agent stabilization, the techniques of this disclosure also may reduce the possibility of leakage of the densifying agent from a densified carbon-carbon preform during subsequent high temperature furnace treatments, such as carbonization. The leakage of pitch from preforms in furnaces at high temperatures may cause cracks in the densified carbon-carbon composite preforms that diminish or eliminate its effectiveness as a composite end product.

Figure 1:
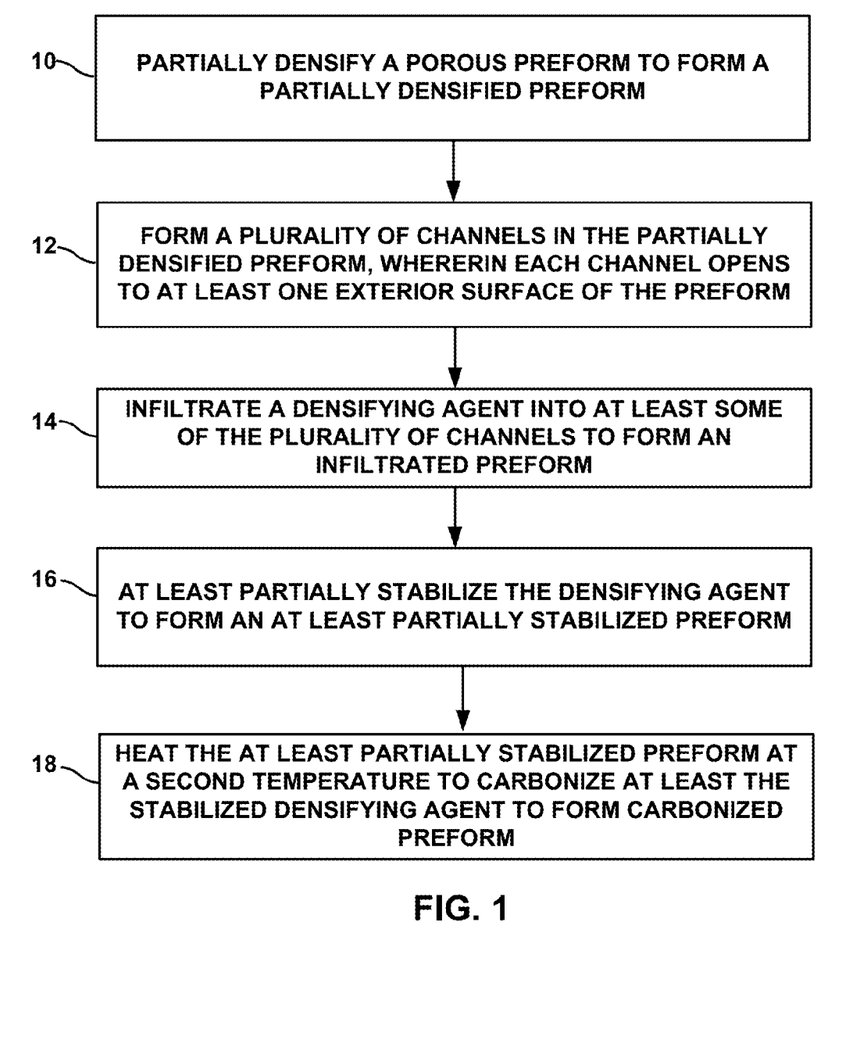
FIG. 1 is a flow diagram illustrating an example technique for forming a carbonized preform according to this disclosure.

FIG. 1 is a flow diagram illustrating an example technique of forming a carbonized preform according to this disclosure. The technique of FIG. 1 will be described with reference to the conceptual diagrams of FIGS. 2-7, which show different views of a porous preform 20 at different steps during the technique of FIG. 1. Although an example porous preform is depicted in FIGS. 2-7, the technique of FIG. 1 can be used with preforms of other types (e.g., other shapes and/or material compositions), and can be used to form partially densified preforms and densified composite materials having different shapes or material compositions.

Figure 2:
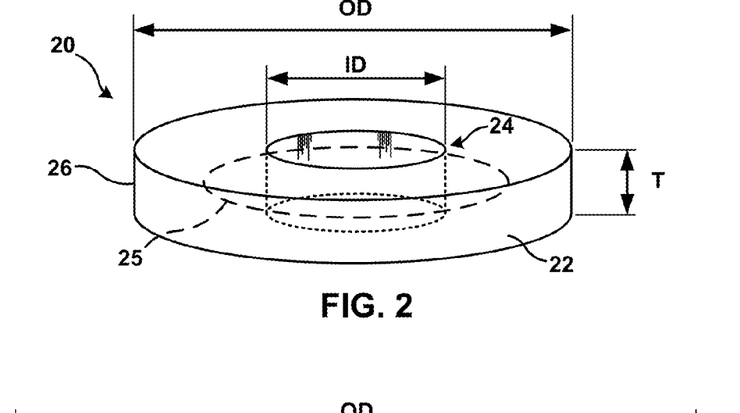
FIG. 2 is a perspective view of an example porous preform.
Figure 3:
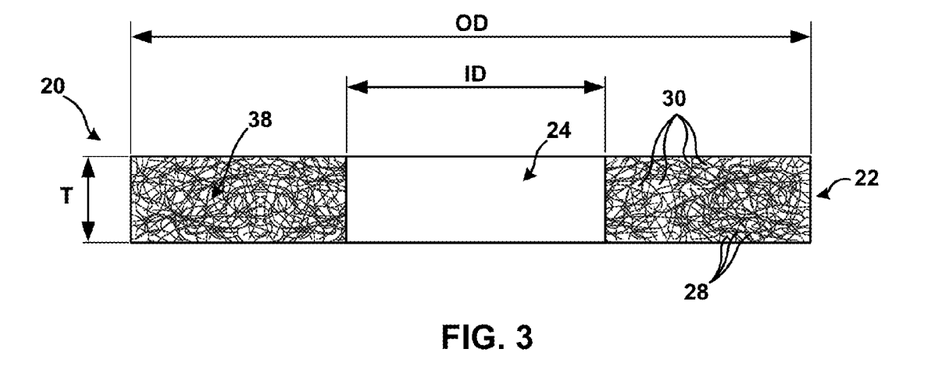
FIG. 3 is a lateral cross-sectional view of the example porous preform of FIG. 2.

The technique of FIG. 1 may include partially densifying a porous preform 20 to form a partially densified preform 40 (10). For example, porous preform 20 (e.g., a porous carbon fiber preform), as shown in FIGS. 2 and 3, may be partially densified using chemical vapor deposition (CVD) or chemical vapor infiltration (CVI) to form partially densified preform 40 (see FIG. 4). Porous preform 20 may include a plurality of fibers or other material, such as carbon-based fibers, carbon fiber precursor fibers, non-carbon-based fibers, or mixtures thereof. In some examples, the fibers may be a woven or non-woven layered material. The fibers also may be woven or mixed together to form sheets. A plurality of different layers of fibers or sheets of material may be stacked on top of one another, for example, in the form of a part which will be processed to become a carbon-carbon composite part. In some examples, a plurality of different layers of woven or mixed fibers (or other material, in some examples) may be shaped, needled, and/or otherwise mechanically affixed together to define porous preform 20.

FIG. 2 is a perspective view of an example porous preform 20. As shown in FIG. 2, porous preform 20 may have a generally disc-shaped geometry so that a carbon-carbon composite material formed from porous preform 20 may be generally disc-shaped, e.g., for use as a brake disc. In other examples, porous preform 20 may define a different geometry. For example, the geometry of porous preform 20 may be similar to or substantially the same as the desired geometry for the finished part formed by the carbon-carbon composite material. Porous preform 20 includes a disc-shaped porous body 22 with a central bore 24 extending through an axial thickness of disc-shaped porous body 22. In some examples, porous preform 20 has an inner diameter ID at bore 24, an outer diameter OD at an outer edge surface 26, and an axial thickness T, which is measured in a direction substantially orthogonal to the direction in which inner diameter ID and outer diameter OD are measured.

Disc-shaped porous body 22 defines a central or inner portion 25, which, in some examples, is approximately equidistant between outer edge surface 26 and bore 24 and approximately equidistant between a top surface and a bottom surface of disc-shaped porous body 22. As used in this disclosure, the term inner portion 25 may refer generally to a geometrically-centered region within preform body 22 of any of the example preforms of this disclosure, wherein the inner portion has a volume that is a predetermined percentage of the total volume of porous preform 20, such as between about 15% and about 50% of the volume of porous preform 20, such as between about 20% and about 30% of the volume of porous preform 20. For example, an inner portion 38 is shown with respect to porous preform 20 in FIG. 3, partially densified preform 40 in FIGS. 4 and 5, infiltrated preform 50 in FIG. 6, and at least partially stabilized preform 60 in FIG. 7.

As an example, for a generally annular preform, such as example porous preform 20 shown in FIG. 2, a geometric center of preform body 22 may generally be an annulus that is generally axially centered within preform body 22, e.g., centered within thickness T, and that is radially centered within preform body 22, e.g., generally centered between inner diameter ID at inner edge surface 32 and outer diameter OD at outer edge surface 26. By way of example, an inner portion may be defined as a predetermined percentage of the radius of preform body 22 on either side of the center annulus, such as at least about 50% of the radius (e.g., at least about 25% of the radius of the center annulus on either side of the center annulus), or at least about 20% of the radius (e.g., at least about 10% of the radius on either side of the center annulus). In other examples, preform body 22 may include a plurality of fibrous layers bonded, laminated, or needle-punched together, and inner portion 38 may include a predetermined number of inner layers of the plurality of layers on either side of a generally axially centered layer.

FIG. 3 is a conceptual diagram illustrating a lateral cross-sectional view of the example porous preform 20 shown in FIG. 2, which is taken along a diameter of porous preform 20. Porous body 22 of porous preform 20 may include, for example, a plurality of fibers 28 that define a plurality of pores 30 within porous body 22. The porosity of porous body 22 extends substantially throughout the thickness T of porous body 22. In some examples, fibers 28 may be bound together by a binder, fibers 28 may be formed into a plurality of fibrous layers (not shown) that are bound or needle-punched together, or fibers 28 may be mechanically joined, e.g., using needle-punching, without previously being formed into distinct fibrous layers. Fibers 28 and pores 30 are not necessarily shown to scale, but rather are shown conceptually in order to illustrate aspects of the present disclosure.

Figure 4:
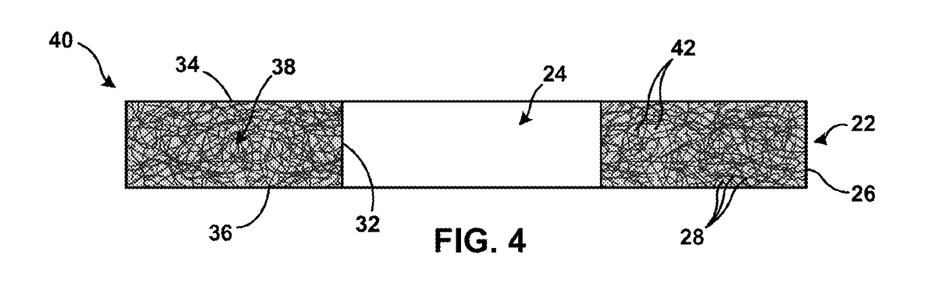
FIG. 4 is a lateral cross-sectional view of an example partially densified preform.

As described, the technique of FIG. 1 includes partially densifying porous preform 20 with one or more densification cycles to form partially densified preform 40 (10). FIG. 4 is a lateral cross-sectional view of example partially densified preform 40. For example, partially densifying porous preform may include performing a CVD/CVI densification cycle, which may deposit a layer of carbon 42 on surfaces of fibers 28. In some examples, the layer of carbon 42 on surfaces of fibers 28 may increase a mechanical strength of porous preform 20, such that porous preform 20 may be less likely to be damaged (e.g., delaminated) by pressures during subsequent processing of preform 20. In some examples, layer of carbon 42 may not fully fill pores 30 of partially densified preform 40, and may leave at least some pores 30 open to outer the outer surface of partially densified preform 40 (e.g., open to outer edge surface 26). However, in some examples, layer of carbon 42 may at least partially close at least some of pores 30.

Figure 5:
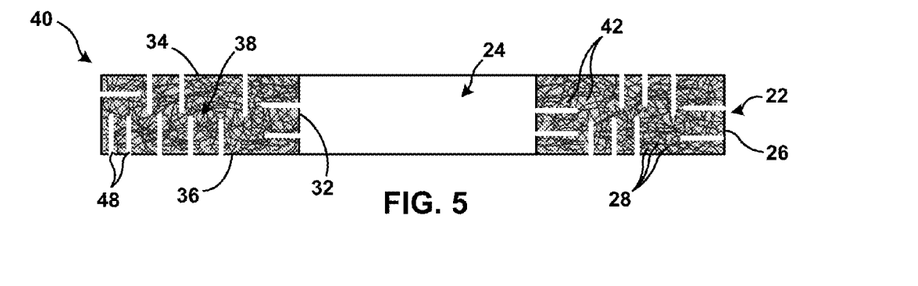
FIG. 5 is a lateral cross-sectional view of an example partially densified preform including a plurality of channels.

The example technique of FIG. 1 further includes forming a plurality of channels 48 in partially densified preform 40, such that each channel of the plurality of channels 48 opens to at least one exterior surface of partially densified preform 40 (12). FIG. 5 is a lateral cross-sectional view of partially densified preform 40 including plurality of channels 48. An exterior surface of partially densified preform 40 may include, for example, a top surface 34, a bottom surface 36, an outer edge surface 26, or an inner edge surface 32 of partially densified preform 40, as shown in FIGS. 4 and 5. Plurality of channels 48 may or may not be drawn to scale in the Figures.

Channels 48 may be created in partially densified preform 40 (such as in a porous carbon matrix between carbon fibers formed by partial densification) by, for example, drilling or laser ablation. In some examples, each channel of plurality of channels 48 is between about 0.25 inches and about 0.75 inches in length. The length of at least some of channels 48 may be sufficient to extend from an outer surface of partially densified preform 40 to a central portion of partially densified preform 40 (e.g., inner portion 25 shown in FIG. 2). Additionally, in some examples, channels 48 may be generally cylindrical in shape with a diameter of less than about 0.015 inches.

Figure 6:
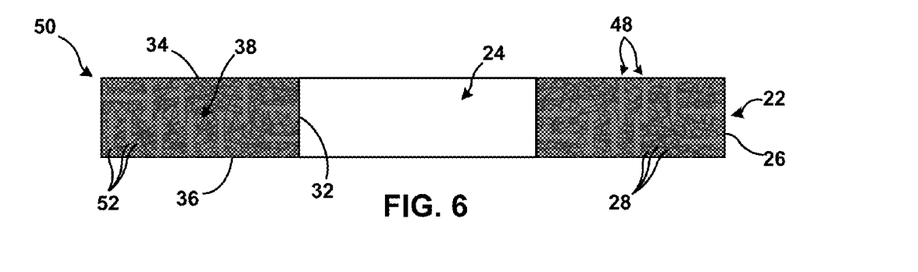
FIG. 6 is a lateral cross-sectional view of an example partially densified preform including a plurality of channels infiltrated with a densifying agent.

The technique of FIG. 1 also includes infiltrating densifying agent 52 into at least some channels of the plurality of channels 48 formed in partially densified preform 40 to form an infiltrated preform 50 (14), as shown at FIG. 6. FIG. 6 is a lateral cross-sectional view of example partially densified preform 40 including plurality of channels 48 infiltrated with densifying agent 52. Densifying agent 52 may include, for example, a pitch, such as a mesophase pitch. Example densifying agents including mesophase pitch include at least one of coal tar, petroleum, or synthetic mesophase pitch. Infiltrating densifying agent 52 into at least some channels of plurality of channels 48 (14) may include using at least one of vacuum pressure infiltration (VPI), high pressure impregnation/carbonization (PIC), or resin transfer molding (RTM), to infiltrate densifying agent 52 into porosity of partially densified preform 40.

In some examples, infiltrating densifying agent 52 into at least some channels of plurality of channels 48 formed in partially densified preform 40 (14) may include using RTM at an increased temperature. For example, infiltrating densifying agent 52 may include using RTM while heating densifying agent 52 and/or preform 50 at the increased temperature to aid infiltration by lowering the viscosity of densifying agent 52, such as using RTM at about 350° C. In some such examples, infiltrated preform 50 may be cooled prior to additional processing. For example, infiltrated preform 50 may be allowed to cool to ambient temperature. In some examples, when infiltrated preform 50 cools from a higher temperature at which densifying agent 52 is infiltrated to a lower ambient temperature, densifying agent 52 may shrink in volume, causing cracks to form in densifying agent 52.

The technique of FIG. 1 further includes at least partially stabilizing densifying agent 52 to form an at least partially stabilized preform 60 (16). In some examples, stabilizing densifying agent 52 (16) may include heating infiltrated preform 50 at a first temperature, such that densifying agent 52 disposed in the at least some channels of plurality of channels 48 may shrink to form a plurality of interconnected cracks 54, and exposing infiltrated preform 50 to an oxidizing agent. The oxidizing agent may include, for example, oxygen from atmospheric air or from the introduction of ozone. In some examples, heating at the first temperature may include heating infiltrated preform 50 at a temperature between about 170° C. and about 200° C., for example heating infiltrated preform 50 at about 170° C. Oxidative stabilization of densifying agent 52 (such as pitch) at the first temperature within this range may increase densification and/or weight gain by infiltrated preform 50 in forming the at least partially stabilized preform 60. The temperature at which infiltrated preform 50 is heated may vary depending on the composition of the densifying agent or pitch material selected.

Figure 7:
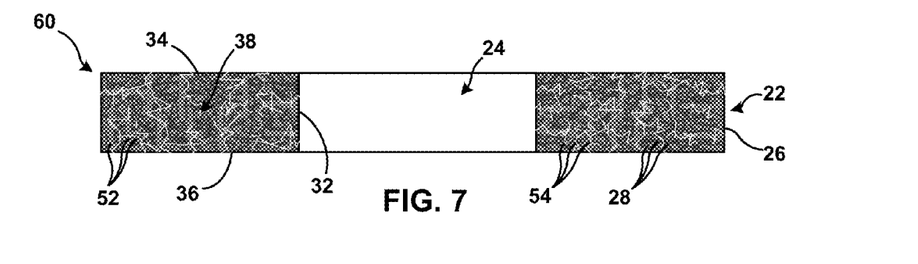
FIG. 7 is a lateral cross-sectional view of an example at least partially stabilized preform.

When heated at the first temperature, densifying agent 52, such as a mesophase pitch, may shrink in volume, causing small, interconnected cracks 54 to form in densifying agent 52, including densifying agent 52 disposed in channels 48. FIG. 7 is a lateral cross-sectional view of at least partially stabilized preform 60, which shows plurality of interconnected cracks 54. Each crack of the plurality of interconnected cracks 54 may or may not be connected to other cracks of plurality of interconnected cracks 54. Plurality of interconnected cracks 54 may or may not be drawn to scale in FIG. 7. As shown in FIG. 7, in some examples, at least some cracks of plurality of interconnected cracks 54 open to at least one exterior surface of at least partially stabilized preform 60. For example, at least some cracks of plurality of interconnected cracks open to at least one of top surface 34, bottom surface 36, interior edge surface 32, or exterior edge surface 26 of at least partially stabilized preform 60, as shown in FIG. 7.

While being heated at the first temperature, densifying agent 52 disposed in infiltrated preform 50 also may be exposed to an oxidizing agent, such as air or oxygen, which may further stabilize densifying agent 52 by, e.g., cross-linking of polymer chains dispersed throughout densifying agent 52. Chains, compounds and/or molecules of densifying agent 52 may be stabilized by exposure to air or oxygen. Exposure to the oxidizing agent may cause constituents of densifying agent 52 to react to form a more highly cross-linked or solidified phase as compared to a more amorphous or viscous phase prior to stabilization. For example, mesophase pitch may be stabilized by reacting the mesophase pitch with oxygen gas to cure the mesophase pitch, converting the thermoplastic mesophase pitch to a thermoset mesophase pitch.

Forming plurality of channels 48 in partially densified preform 40 may facilitate in ingress and/or egress of fluids to and from the preform during subsequent processing steps. For example, channels 48 may enhance the ability of the oxidizing agent (such as oxygen gas) to diffuse into an inner portion of infiltrated preform 50 during stabilizing densifying agent 52 of infiltrated preform 50 (16). The cracking of densifying agent 52 disposed in porosity and channels 48 of infiltrated preform 50 may allow the oxidizing agent to more easily and quickly diffuse into and through an inner portion of infiltrated preform 50 and thereby cross-link or cure densifying agent 52 with which the oxygen comes in to contact.

For example, the oxygen stabilization of pitch during the processing of pitch-densified preforms can take weeks for preforms having large dimensions (e.g., up to eight weeks). The duration of the oxygen stabilization step may be affected by the low porosity and relatively small pores of pitch, which may hinder or substantially prevent diffusion of oxygen in to an inner portion of the preform. In some examples, when stabilization of pitch is considered complete, pitch that has not fully stabilized remains trapped in central regions or inner portions of the preform and can leak during subsequent processing steps, including high temperature carbonization of the pitch. This disclosure provides techniques that facilitate greater gas diffusion throughout a preform, by opening channels 48 that allow for the ingress of the oxidizing agent or other stabilizing fluid. For example, when exposing infiltrated preform 50 to an oxidizing agent, the oxidizing agent may diffuse throughout substantially all (e.g., all or nearly all) of infiltrated preform 50 via at least some cracks of plurality of cracks 54 formed in pitch disposed in channels 48, such that the oxidizing agent may more easily diffuse into inner portion 38 of infiltrated preform 50, as compared to infiltrated preforms that do not include channels 48. An oxidizing agent also may diffuse throughout infiltrated preform 50 via remaining pores 30, channels 48, or other porosity remaining in densifying agent 52, for example. In some circumstances, without a preform with enhanced porosity (such as a preform including plurality of channels 48 discussed herein), it may be difficult for an oxidizing agent to reach and oxidize pitch or phenolic material that has been infiltrated into the inner portion 38 of the preform.

In some examples, the opening of channels 48 also allows for the egress of gases or other volatiles generated during the processing of partially densified preforms, infiltrated preforms, or partially stabilized preforms, as described herein. For example, pressure generated by trapped gases or other volatiles when stabilized pitch infiltrated in preforms carbonizes may cause damage to a preform, including linear cracks. Forming channels 48 in a preform may reduce or substantially prevent cracking of the preform or bubbling of water vapor or other gases from within the preform during carbonization processing.

In some examples, channels 48 may reduce the time required for oxidative stabilization of densifying agent 52 infiltrated in preforms. For example, forming channels 48 in infiltrated preform 50 may reduce the time for oxidative stabilization may be reduced to about 20 to 25 days. In some examples, channels 48 may lead to increased stabilization of pitch in the central portion of infiltrated preform 50, which may reduce the possibility of leakage of densifying agent 52 from an at least partially stabilized preform 60 during subsequent high temperature furnace treatments. The leakage of pitch from preforms in furnaces at high temperatures may cause linear cracks in the densified carbon-carbon composite preforms that diminish or eliminate its effectiveness as a composite end product. Ultimate yields of carbon content in preforms and composite parts also may be increased by use of the described techniques.

The technique of FIG. 1 further may include heating at least partially stabilized preform 60 at a second temperature to carbonize at least the stabilized densifying agent 52 to form a carbonized preform (18). In some examples, the second temperature may be between about 650° C. and about 900° C. The temperature may vary depending on the content of the stabilized densifying agent 52 and/or the content of fibers included in at least partially stabilized preform 60 (e.g., carbon fiber precursor fibers or carbon fibers). Carbonization of at least the stabilized densifying agent 52 to form a carbonized preform may include, for example, heating a stabilized mesophase pitch at the second temperature to convert carbon precursors in the stabilized mesophase pitch to carbon, and further strengthen a carbon matrix between plurality of fibers 28, such as carbon fibers. In other examples, porous preform 20 (and partially stabilized preform 60, according to the technique of FIG. 1) may include carbon fiber precursor fibers (e.g., polyacrylonitrile (PAN) fibers), which also may be carbonized when heated at the second temperature.

In some examples, although not shown in FIG. 1, the carbonized preform may be further densified. For example, the carbonized preform may be further densified using at least one of CVD or CVI, to form a carbon-carbon composite material or part. Alternatively or additionally, the carbonized preform may be further densified by infusing at least one of phenolic resin or furfuryl alcohol in to remaining porosity of the carbonized preform, then carbonizing the at least one of phenolic resin or furfuryl alcohol. Phenolic resin or furfuryl alcohol may be infused into a carbonized preform by, for example, VPI, PIC, or RTM.

Figure 8:
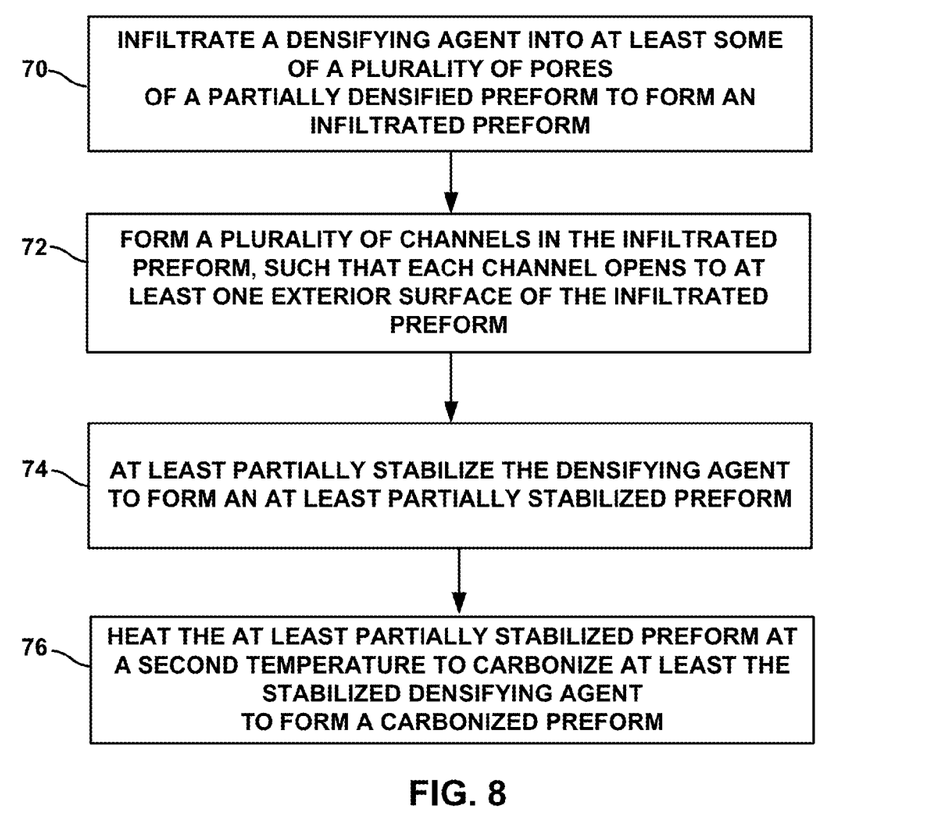
FIG. 8 is a flow diagram illustrating another example technique for forming a carbonized preform according to this disclosure.

In some examples, certain steps of the technique of FIG. 1 may be performed in a different order. For example, partially densified preform 40 (FIG. 4) may be infiltrated with densifying agent 52 before the forming of plurality of channels 48 in the preform. FIG. 8 is a flow diagram illustrating another example technique of forming a carbonized preform, according to this alternative technique. The steps of the technique of FIG. 8 may be similar to or the same as the steps of the technique of FIG. 1, except that, as noted, the technique of FIG. 8 includes infiltrating densifying agent 52 into partially densified preform 40 prior to forming channels 48 in the preform.

The technique of FIG. 8 may include infiltrating densifying agent 52 into at least some pores of a plurality of pores within partially densified preform 40 (70). For example, a carbon matrix that is disposed between and connects plurality of fibers 28 of partially densified preform 40 may be porous, and a mesophase pitch may be infiltrated into those pores. In some examples (not shown in FIG. 8), prior to infiltrating densifying agent 52, a technique also may include partially densifying porous preform 20 using at least one of chemical vapor deposition (CVD) or chemical vapor infiltration (CVI) to form partially densified preform 40.

The technique of FIG. 8 also includes forming plurality of channels 48 in the infiltrated preform, such that each channel of plurality of channels 48 opens to at least one exterior surface of infiltrated preform 50 (72). In some examples, the forming of channels 48 in the infiltrated preform may include mechanically opening channels, by using drilling or laser ablation, for example. When plurality of channels 48 are formed in an infiltrated preform that already has been infiltrated with densifying agent 52, the channels 48 may provide paths for the oxidizing agent to flow into a central or inner portion of the infiltrated preform.

The technique of FIG. 8 further includes at least partially stabilizing at least densifying agent 52 to form an at least partially stabilized preform (74). In some examples, stabilizing at least densifying agent 52 (74) may include heating the infiltrated preform comprising plurality of channels 48 at a first temperature, as described above. Stabilizing at least densifying agent 52 (74) also may include exposing the infiltrated preform comprising plurality of channels 48 to an oxidizing agent. Similar to or the same as the technique of FIG. 1, the technique of FIG. 8 also may include heating the at least partially stabilized preform at a second temperature to carbonize at least the stabilized densifying agent 52 to form carbon (76). In this technique, the first temperature may be between about 170° C. and about 200° C. (e.g., about 170 ° C.), and the second temperature may be between about 650° C. and about 900° C.

Various examples have been described. These and other examples are within the scope of the following claims.

The invention claimed is:

1. A method comprising:
    partially densifying a porous preform to form a partially densified preform;
    forming a plurality of channels in the partially densified preform, wherein each channel of the plurality of channels opens to at least one exterior surface of the partially densified preform and defines a diameter of less than about 0.015 inch;
    infiltrating a densifying agent into at least some channels of the plurality of channels formed in the partially densified preform to form an infiltrated preform;
    at least partially stabilizing the densifying agent to form an at least partially stabilized preform by at least:
        heating the infiltrated preform at a first temperature, such that the densifying agent disposed in the at least some channels shrinks to form a plurality of interconnected cracks, and
        exposing the infiltrated preform to an oxidizing agent; and
    heating the at least partially stabilized preform at a second temperature to carbonize at least the stabilized densifying agent to form a carbonized preform.

2. The method of claim 1, wherein forming the plurality of channels comprises at least one of drilling or using laser ablation.

3. The method of claim 1, wherein infiltrating the densifying agent comprises using at least one of resin transfer molding (RTM), vacuum pressure infiltration (VPI), or high pressure impregnation/carbonization (PIC).

4. The method of claim 1, wherein the densifying agent comprises a pitch.

5. The method of claim 4, wherein the pitch comprises a mesophase pitch, and wherein the mesophase pitch comprises at least one of coal tar, petroleum, or synthetic pitch.

6. The method of claim 1, wherein partially densifying the porous preform comprises using at least one of chemical vapor deposition (CVD) or chemical vapor infiltration (CVI).

7. The method of claim 1, wherein each channel of the plurality of channels is between about 0.25 inches and about 0.75 inches in length.

8. The method of claim 1, wherein the first temperature is between about 170° C. and about 200° C., and the second temperature is between about 650° C. and about 900° C.

9. The method of claim 1, wherein at least some interconnected cracks of the plurality of interconnected cracks open to at least one exterior surface of the at least partially stabilized preform.

10. The method of claim 1, wherein exposing the infiltrated preform to the oxidizing agent comprises exposing the infiltrated preform to the oxidizing agent such that the oxidizing agent penetrates an inner portion of the infiltrated preform at least via at least some of the plurality of interconnected cracks.

11. The method of claim 1, further comprising, after forming the carbonized preform, further densifying the carbonized preform using at least one of chemical vapor deposition (CVD) or chemical vapor infiltration (CVI) to form a carbon-carbon composite material.

12. The method of claim 1, further comprising, after forming the carbonized preform, further densifying the carbonized preform by:
    infusing at least one of phenolic resin or furfuryl alcohol in to remaining porosity of the carbonized preform; and
    carbonizing the at least one of phenolic resin or furfuryl alcohol.

13. A method comprising:
    infiltrating a densifying agent into at least some pores of a plurality of pores of a partially densified preform to form an infiltrated preform;
    forming a plurality of channels at least partially in the densifying agent of the infiltrated preform, such that each channel of the plurality of channels opens to at least one exterior surface of the infiltrated preform and defines a diameter of less than about 0.015 inch;
    at least partially stabilizing at least the densifying agent to form an at least partially stabilized preform by at least:
    heating the infiltrated preform comprising the plurality of channels at a first temperature, and
    exposing the infiltrated preform comprising the plurality of channels to an oxidizing agent to stabilize at least the densifying agent and form the at least partially stabilized preform;
    heating the at least partially stabilized preform at a second temperature to carbonize at least the stabilized densifying agent to form a carbonized preform.

14. The method of claim 13, wherein forming the plurality of channels comprises at least one of drilling or using laser ablation.

15. The method of claim 13, wherein the first temperature is between about 170° C. and about 200° C., and the second temperature is between about 650° C. and about 900° C.

16. The method of claim 13, wherein the densifying agent comprises a mesophase pitch.

17. The method of claim 13, further comprising, prior to infiltrating the densifying agent, partially densifying a porous preform using at least one of chemical vapor deposition (CVD) or chemical vapor infiltration (CVI) to form the partially densified preform.

* * * * *